(12) United States Patent
Khan et al.

(10) Patent No.: US 6,488,158 B1
(45) Date of Patent: Dec. 3, 2002

(54) BOAT FOR ORGANIC AND CERAMIC FLIP CHIP PACKAGE ASSEMBLY

(75) Inventors: Mohammad Khan, San Jose, CA (US); Raj N. Master, San Jose, CA (US); Maria G. Guardado, San Jose, CA (US); Loo L. Teoh, Penang (MY); Ahmad Juwanda, P. Pinang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 65 days.

(21) Appl. No.: 09/659,826

(22) Filed: Sep. 11, 2000

Related U.S. Application Data

(60) Provisional application No. 60/214,744, filed on Jun. 29, 2000.

(51) Int. Cl.[7] ............................................... A47G 19/08
(52) U.S. Cl. ..................................... 211/41.18; 438/115
(58) Field of Search .................. 382/146; 250/559.34; 165/80.4; 257/714, 713, 698; 438/613, 614, 115; 211/41.18; 428/576; 29/840, 25.01

(56) References Cited

U.S. PATENT DOCUMENTS 6,278,797 B1 * 8/2001 Nagasaki .................... 382/146

* cited by examiner

Primary Examiner—John F. Niebling
Assistant Examiner—Andre' C. Stevenson

(57) ABSTRACT

A boat is formed with a plurality of through-holes sized to securely maintain ceramic or organic flip chip semiconductor packages in place during assembly. Embodiments comprises a boat having a bottom layer with an array of four-sided through-holes and a top layer with an array of through-holes and tabs extending from the sides of the through-hole. Embodiments further include a boat having a bottom layer with through-holes smaller than substantially aligned overlying through-holes in the top layer, the substantially aligned through-holes forming flip chip package holding pockets. An alignment mechanism ensures that components are accurately positioned on flip chip packages held in the boat during assembly.

16 Claims, 3 Drawing Sheets

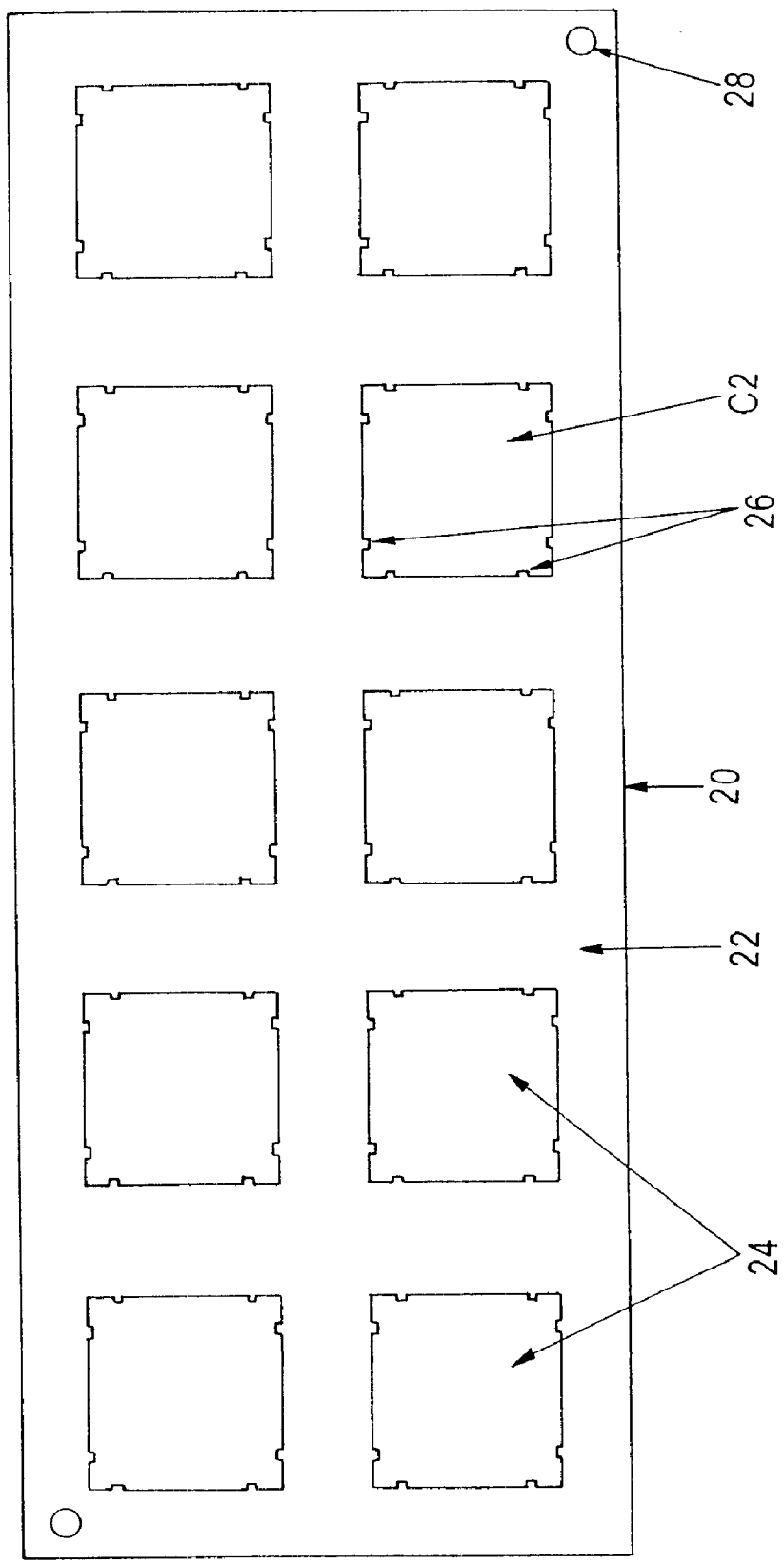

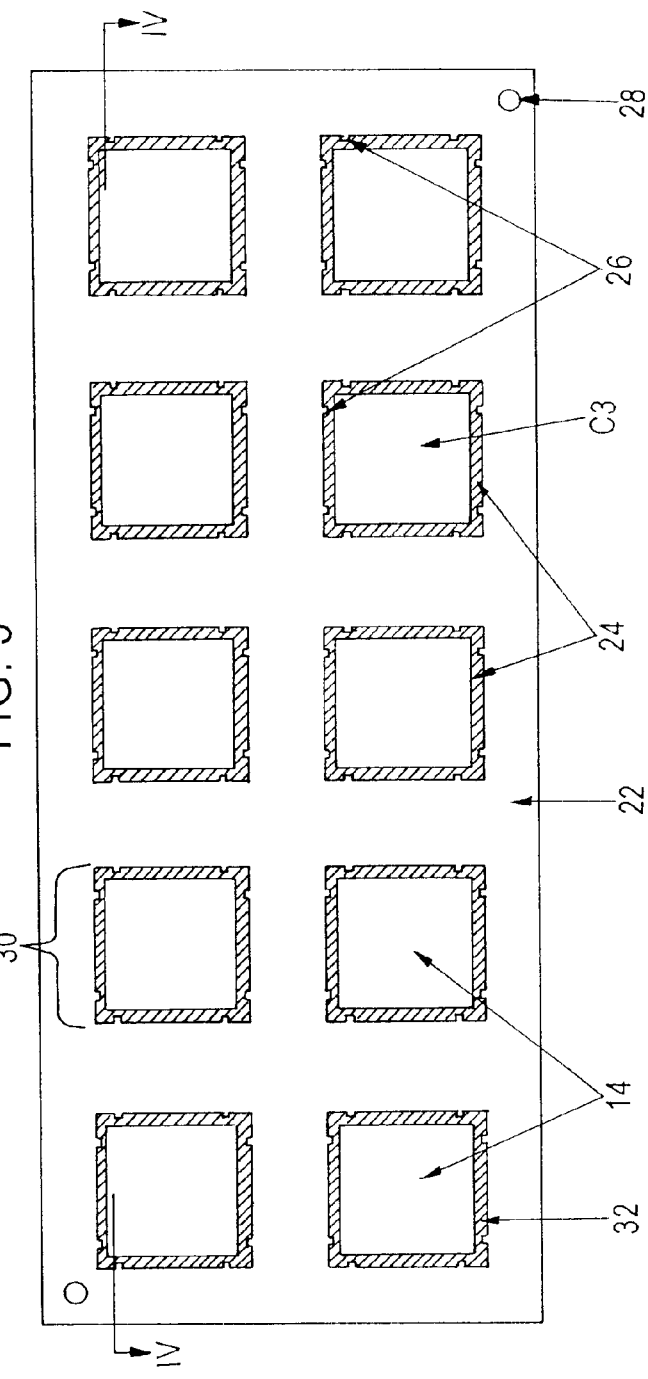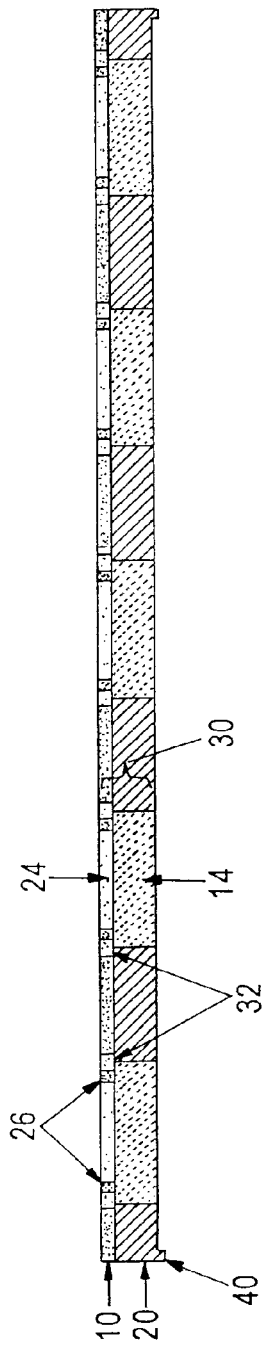

BOAT FOR ORGANIC AND CERAMIC FLIP CHIP PACKAGE ASSEMBLY

RELATED APPLICATIONS

This application claims priority from U.S. Provisional Application Ser. No. 60/214,744, filed Jun. 29, 2000, incorporated herein by reference.

TECHNICAL FIELD

The present invention relates to the field of semiconductor packaging, and more specifically to a boat for holding and aligning semiconductor flip chip packages during assembly.

BACKGROUND ART

Conventional flip chip package assemblies derive their name from the fact that an interconnect die, having all terminations (e.g., solder pads or bump contacts) on one surface, is flipped over for attachment to a substrate in a manner that allows the interconnect die terminations to couple with the substrate to form an electrical and mechanical connection. Flip chip assemblies and flip chip packages are supported because the interconnect die and other components consume limited substrate space, thereby enabling the formation of flip chip packages having high density and low inductance.

In a conventional flip chip assembly process, the die and substrate pass through flux dipping and chip mounter machines, wherein a bonding material, such as solder, is applied to the die and substrate and then the parts are mounted together. The die/substrate combination is then passed through a reflow oven that heats the bonding material to a temperature adequate to melt the material and attach the die to the substrate. The semi-assembled flip chip package can then be transported to a flux cleaning machine, an underfill dispenser and a vertical cure oven. Manufacturers can alter this process by adding or removing steps. The elements of each step may also vary depending on the particular semiconductor package being assembled and a manufacturer's specific requirements.

In an effort to improve yield percentages and increase production speeds, many of the machines involved in flip chip assembly are typically programmed to perform the same function repeatedly and according to standardized parameters. Standardized package location is one such parameter. Flip chip assembly machines are programmed to assume that a package is in a precise location when the package enters a particular assembly step, such as die mounting, fluxing or seal placement. This allows the machine to go to the same location every time in order to complete its assigned task in the assembly process. In order for this kind of standardized repetition to yield positive production benefits, the package must be precisely positioned at an expected location, otherwise inefficiency results. For example, the machine will still complete its task without regard to package location resulting in an improperly assembled package that must either be reworked or discarded. In other instances, the machine may be programmed to look for the package before performing its assigned task, thereby reducing the need for rework, but also disadvantageously slowing production. Consequently, semiconductor device production is improved when the components are held in a precise location throughout the assembly process in way that allows each machine to perform its task as programmed.

Unassembled and semi-assembled flip chip packages are usually held in a carrying device during flip chip assembly. Carrying devices are useful because they make it easier for manufacturers to transport packages without direct physical contact, thereby reducing the likelihood of contamination and other damage attendant upon excessive handling. Carrying devices also make it easier to increase production speeds, because their ability to hold multiple flip chip packages allows manufacturers to move several packages at once and allows machines to work on more than one semiconductor package at a time or to move quickly from one package to another. However, a manufacturer's ability to enjoy these benefits depends on whether package placement can be maintained in a standardized location during flip chip assembly. However, such package retention is difficult for at least two reasons.

First, semiconductor packages come in varying dimensions, thereby imposing a limitation on the extent to which manufacturers can rely on a carrying device maintaining a package in a precise location. For example, some packages are too large to fit into a standardized carrying device holding pocket, while others are so small that they fall through the hole in the bottom of the pocket. Package weight also affects package retention in a carrying device holding pocket. For example, lighter packages are easily jostled out of the pocket during transport or assembly. If a flip chip package does not fit or remain in the carrying device holding pocket, a machine will not operate properly according to package location-dependent instructions.

Existing carrying device designs exacerbate this problem. Currently, the same carrying device holds flip chip packages of all sizes, supported on a single shelf. The pocket opening, shelf size and hole though the pocket bottom are not designed to accommodate specific package sizes. Thus, if the package is smaller in length or width than the pocket opening, the package can slide around on the shelf in varying directions (e.g., side to side, up and down, or pivoting from a package corner). The resulting friction or collision between the carrying device and the flip chip package can damage the substrate, die or any other attached flip chip package elements (e.g., pins or balls). Furthermore, this movement moves the flip chip package from its precise location within the carrying device holding pocket, therefore increasing the likelihood that a flip chip assembly machine will be unable to properly perform its assigned task.

There is a need for a carrying device that can retain flip chip packages (e.g., ceramic or organic flip chip packages) in place during flip chip assembly.

SUMMARY OF THE INVENTION

The present invention comprises a boat for maintaining flip chip packages in place during assembly. Embodiments of the present invention include a boat for holding flip chip packages (e.g., ceramic or organic flip chip packages) having a bottom layer with an array of four-sided through-holes and a top layer having an array of through-holes with tabs extending from the sides of the through-hole. Each through-hole in the bottom layer is smaller than the overlying top layer through-hole. The top layer is attached to the bottom layer so that the central axis of each bottom layer through-hole is substantially aligned with the central axis of an overlying top layer through-hole. An alignment mechanism ensures that lids are accurately placed on flip chip packages held in the boat during assembly.

Boats in accordance with embodiments of the present invention advantageously maintain organic and ceramic flip chip packages in place in a standardized location in the boat during assembly, thereby improving production standardization and enabling assembly steps to be completed rapidly and repeatedly with little or no human intervention. In addition, damage that can occur when an assembly step is attempted or completed on a ceramic or organic flip chip package improperly seated in the boat is avoided or significantly limited.

In accordance with embodiments of the present invention, packages are prevented from extending through or falling out of the boat, thereby increasing manufacturing through put and reducing costs vis-à-vis conventional carrying devices. In addition, boats can be designed to accommodate flip chip packages of varying sizes, thereby enabling manufacturers to use the same boat for many different flip chip packages, eliminating the need for multiple boats and for retrofitting assembly equipment to accommodate different flip chip boat designs.

Other advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

FIG. 2 illustrates a plan view of the top layer of a boat constructed in accordance with an embodiment of the present invention FIG. 3 shows a top view of a boat, in accordance with an embodiment of the present invention, where the top layer of FIG. 2 is attached to the bottom layer of FIG. 1.

FIG. 4 depicts a cross-section of the boat of FIG. 3 taken along line IV—IV, in accordance with an embodiment of the present invention.

DETAILED DESCRIPTION OF THE INVENTION

Figure 1:
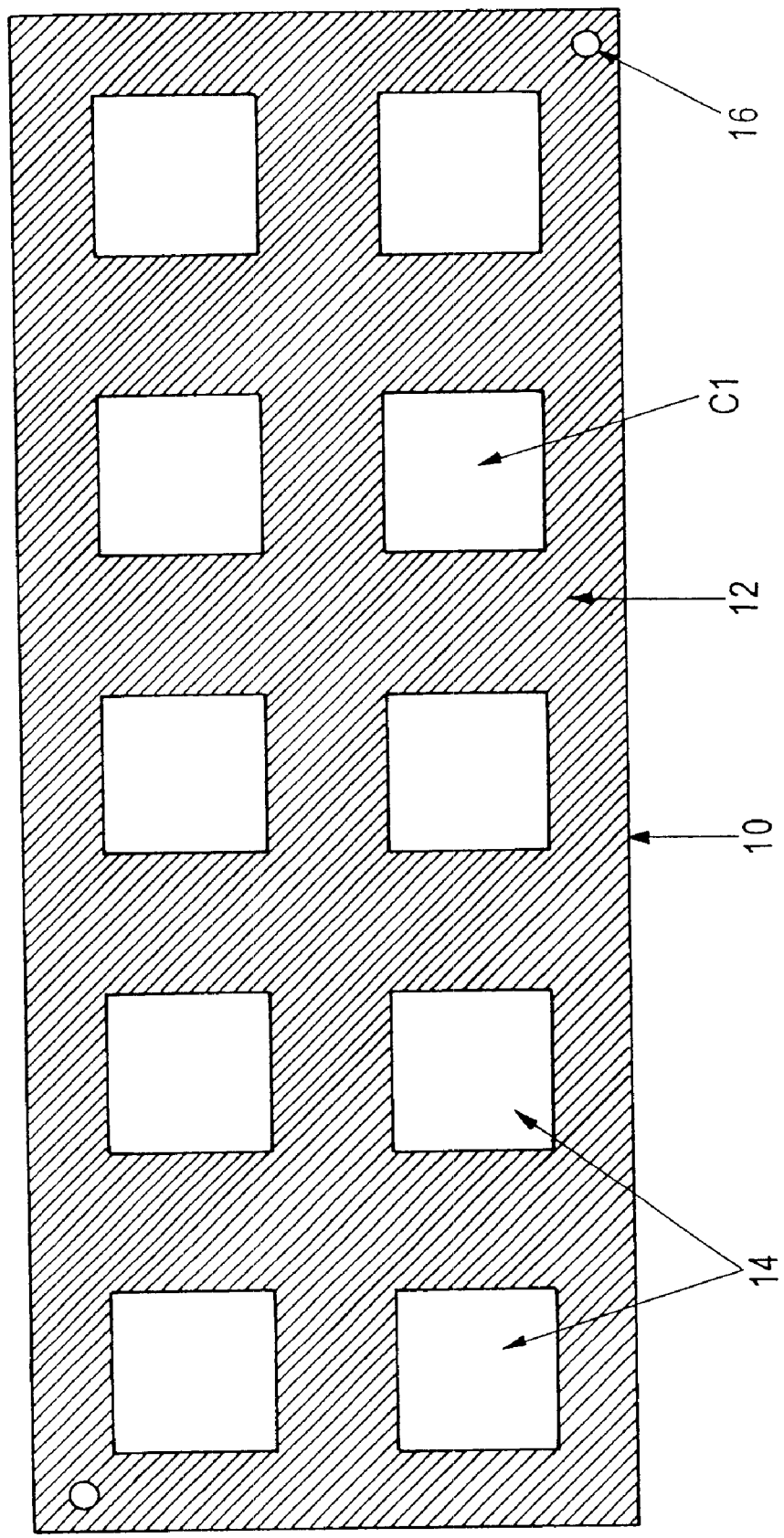
FIG. 1 is a top view of the bottom layer of a boat constructed in accordance with an embodiment of the present invention.

The present invention addresses and solves problems attendant upon flip chip package damage, as with ceramic or organic flip chip packages, typically occurring during assembly as a result of unwanted package movement or dislodgment associated with conventional carrying devices. This objective is achieved by providing a boat with superior holding and retaining capabilities. Embodiments of the present invention comprise a boat having a bottom layer, a top layer, and an alignment mechanism to properly locate the boat, with flip chips contained therein. An embodiment of the present invention is schematically illustrated in FIGS. 1–4, wherein similar features bear similar references.

FIG. 1 depicts a top view of the bottom layer 10 of the boat, which is substantially rectangular in shape. The bottom layer 10 has an upper surface 12, a lower surface (not visible), and an array of four-sided through-holes 14. The bottom layer through-holes 14 are spaced apart at a distance so that a flip chip package is held in a non-contacting relationship with other flip chip packages held in the boat. In an embodiment of the present invention shown in FIG. 1, the through-holes 14 in the bottom layer 10 are substantially equidistant from each other. Further, each bottom layer through-hole 14 has a central axis C1. Bottom layer 10 is provided with two alignment holes 16 in opposing corners. Additional alignment holes 16 may be included. These alignment holes 16 are used in conjunction with the alignment holes of the top layer to properly position the boat containing flip chip packages in assembly machines.

FIG. 2 illustrates a top layer 20 having an upper surface 22, a lower surface (not visible), and an array of four-sided through-holes 24 with tabs 26. In an embodiment of the present invention, the top layer 20 is substantially rectangular.

Each top layer through-hole 24 has a cross-sectional area larger than the cross-sectional area of each bottom layer through-hole 14. In an embodiment of the present invention shown in FIG. 2, each top layer through-hole 24 has a central axis C2 substantially aligned with the central axis C1 in each bottom layer through-hole 14.

The top layer 20 has two alignment holes 28, which substantially overlap the bottom layer alignment holes 16. Additional alignment holes 28 may be included. The combined alignment holes 28 and 16 ensure that the package is always in the same location when components, such as a lid, are mounted on a flip chip package. For example, in the highly automatic, high speed flip chip assembly process, the lid mounting equipment must come down and engage the flip chip package in the same location every time. This same problem is experienced with die placement, sealing and other assembly steps. This is difficult to accomplish with accuracy using conventional assembly methods and carrying devices because of package movement within the carrying device and difficulties associated with consistently aligning the carrying device in the lid mounting equipment. The present invention eliminates or significantly minimizes this problem by using the bottom alignment holes 16 and top alignment holes 28 to ensure that the boat, and consequently the flip chip packages held therein, are consistently found in the same location so that assembly equipment, such as lid mounting equipment, automatically and accurately completes its assigned task. This, in turn, increases flip chip package output quality and reduces rework.

Turning to FIG. 3, which depicts a top view of an embodiment of the boat constructed in accordance with an embodiment of the present invention, the top layer 20 is attached to the bottom layer 10 so that each top layer through-hole 24 is substantially aligned with a corresponding bottom layer through-hole 14 to form a holding pocket 30. The holding pocket 30 has a support shelf 32 comprising a portion of the upper surface 12 of the bottom layer 10 exposed through the top layer through-hole 24. Flip chip packages can rest on the support shelf 32 without any pins, leads, pads or other components on the package surface coming into contact with the boat.

The top layer 20 may be attached to the bottom layer 10 by any of various joining techniques, such as spot welding. The layers also may be attached using adhesives, pins, clamps, screws and other means.

Each top layer through-hole 24 has at least one tab 26 extending from each of its four sides substantially perpendicular to and away from the sides of each top layer through-hole 24 and substantially level with the upper surface 22 of the top layer 20. As shown in FIG. 3, each tab 26 is shorter in length than the surface width of the support shelf 32. These tabs 26 facilitate locating a flip chip package in the boat by maintaining the package oriented along its x and y axis within a holding pocket 30. This, in turn, improves production through put because the resulting standardized package location increases the ability to automate assembly steps and to perform the automated assembly steps at high speeds with increased accuracy.

The tabs 26 and support shelf 32 are also designed to accommodate ceramic and organic flip chip packages of varying size. This allows a single boat to be used for more than one type of flip chip package, thus reducing the cost of assembly by eliminating the need to use a variety of boats and to retrofit or adjust assembly equipment to accommodate differing boats and flip chip packages.

As shown in FIG. 3, the present invention has ten holding pockets 30. Alternative embodiments include boats having five or more holding pockets 30.

In the cross-section illustrated in FIG. 4 of a portion of a boat constructed in accordance with an embodiment of the present invention, the bottom layer 10 has one or more supports 40 extending downwardly at substantially right angles from at least one pair of opposing sides of the bottom layer 10. When a flip chip package is placed in a holding pocket 30, terminal leads, pins or contacts often face downward. The supports 40 uphold the boat as it moves through the assembly process (e.g. as on a belt) and prevents the leads, pins or contacts on the flip chip package from coming into undesired contact with the assembly equipment.

In an embodiment of the present invention, the top layer 20 and bottom layer 10 are made from a material resistant to warping, melting or degradation at a temperature of about 200° C. to about 400° C., such as aluminum, copper, stainless steel or high temperature plastics. This allows the boat to be used to carry flip chip packages through assembly steps requiring exposure to high temperatures, as where organic or ceramic flip chip packages are fed into a flux machine (e.g., high temperature flux is used for ceramic packages at temperatures ranging from 335° C. to 375° C. and for organic packages at temperatures of 215° C. to 260° C.).

The present invention enjoys industrial applicability in fabricating any of various types of semiconductor devices. The present invention has particular applicability in packaging flip chip semiconductor packages.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A boat for holding semiconductor packages during flip chip assembly, the boat comprising:

a substantially rectangular bottom layer having an upper surface, a lower surface, an array of four-sided through-holes and at least two alignment holes; and a substantially rectangular top layer having an upper surface, a lower surface, an array of four-sided through-holes with tabs and at least two alignment holes.

2. The boat according to claim 1, wherein the bottom layer comprises one or more supports extending downwardly at substantially right angles from at least one pair of opposing sides of the bottom layer.

3. The boat according to claim 1, wherein the bottom layer through-holes are spaced apart at a distance such that a semiconductor package can be held in a non-contacting relationship with other semiconductor packages held in the boat.

4. The boat according to claim 1, wherein the top layer through-holes have a cross-sectional area larger than that of the bottom layer through-holes.

5. The boat according to claim 4, wherein each top layer through-hole has a central axis and each bottom layer through-hole has a central axis substantially aligned with the central axis of an overlying top layer through-hole.

6. The boat according to claim 5, wherein the top layer is attached to the bottom layer so that each top layer through-hole aligned with an underlying bottom layer through-hole form a holding pocket having a support shelf comprising an exposed upper surface of the bottom layer about the underlying bottom layer through-hole.

7. The boat according to claim 6, wherein the top layer is attached to the bottom layer via spot welding.

8. The boat according to claim 5, wherein each top layer through-hole has at least one tab extending from each of its four sides.

9. The boat according to claim 8, wherein each top layer through-hole has two tabs extending from each of its four sides.

10. The boat according to claim 8, wherein each tab:

extends substantially perpendicular to and away from the sides of each top layer through-hole;

is shorter in length than the surface width of the support shelf; and is substantially level with the upper surface of the top layer.

11. The boat according to claim 1, wherein the. top layer alignment holes substantially overlap the bottom layer alignment holes in opposing corners of the top layer and bottom layer.

12. The boat according to claim 1, wherein the top layer and bottom layer comprise a material resistant to warping, melting or degradation at a temperature of about 200° C. to about 400° C.

13. The boat according to claim 12, wherein the top layer and bottom layer comprise a material resistant to warping, melting or degradation at a temperature of about 215° C. to about 260° C.

14. The boat according to claim 12, wherein the top layer and bottom layer comprise a material resistant to warping, melting or degradation at a temperature of about 335° C. to about 375° C.

15. The boat according to claim 6, comprising 5 or more holding pockets.

16. The boat according to claim 3, wherein the through-holes in the bottom layer are spaced substantially equidistant from each other.

* * * * *